(12) United States Patent
Wang et al.

(10) Patent No.: US 10,971,519 B2
(45) Date of Patent: Apr. 6, 2021

(54) NON-VOLATILE MEMORY STRUCTURE

(71) Applicant: Powerchip Semiconductor Manufacturing Corporation, Hsinchu (TW)

(72) Inventors: Zih-Song Wang, Nantou County (TW); Chen-Liang Ma, Taoyuan (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 16/507,065

(22) Filed: Jul. 10, 2019

(65) Prior Publication Data
US 2020/0365613 A1    Nov. 19, 2020

(30) Foreign Application Priority Data
May 15, 2019 (TW) .................................. 108116754

(51) Int. Cl.
*H01L 27/11582* (2017.01)
*H01L 29/16* (2006.01)
*H01L 29/04* (2006.01)
*H01L 29/51* (2006.01)

(52) U.S. Cl.
CPC ........ *H01L 27/11582* (2013.01); *H01L 29/04* (2013.01); *H01L 29/16* (2013.01); *H01L 29/513* (2013.01); *H01L 29/518* (2013.01)

(58) Field of Classification Search
None
See application file for complete search history.

(56) References Cited

U.S. PATENT DOCUMENTS

| | | | | |
|---|---|---|---|---|
| 10,304,852 | B1* | 5/2019 | Cui | H01L 21/76229 |
| 2013/0087843 | A1* | 4/2013 | Han | B82Y 10/00 |
| | | | | 257/315 |
| 2016/0141419 | A1* | 5/2016 | Baenninger | H01L 27/11551 |
| | | | | 257/314 |
| 2018/0211969 | A1* | 7/2018 | Lue | H01L 21/76802 |
| 2020/0286917 | A1* | 9/2020 | Kaminaga | H01L 21/76877 |
| 2020/0321444 | A1* | 10/2020 | Lien | H01L 27/11582 |

* cited by examiner

Primary Examiner — Long Pham
(74) Attorney, Agent, or Firm — JCIPRNET

(57) ABSTRACT

A non-volatile memory structure including a substrate, a stacked structure, a conductive pillar, a channel layer, a charge storage structure, and a second dielectric layer is provided. The stacked structure is disposed on the substrate and has an opening. The stacked structure includes first conductive layers and first dielectric layers alternately stacked. The conductive pillar is disposed in the opening. The channel layer is disposed between the stacked structure and the conductive pillar. The charge storage structure is disposed between the stacked structure and the channel layer. The second dielectric layer is disposed between the channel layer and the conductive pillar. The non-volatile memory structure can effectively improve the electrical performance and the reliability of the memory device.

20 Claims, 3 Drawing Sheets

NON-VOLATILE MEMORY STRUCTURE

CROSS-REFERENCE TO RELATED APPLICATION

This application claims the priority benefit of Taiwan application serial no. 108116754, filed on May 15, 2019. The entirety of the above-mentioned patent application is hereby incorporated by reference herein and made a part of this specification.

BACKGROUND OF THE INVENTION

Field of the Invention

The invention relates to a memory structure, and particularly relates to a non-volatile memory structure.

Description of Related Art

The non-volatile memory is capable of storing, reading, and erasing data repeatedly and have the advantages that the stored data does not disappear even after the power supply is turned off, the data access time is short, and the power consumption is low. Therefore, the non-volatile memory has become a kind of memory extensively used in the personal computer and the electronic equipment.

However, as the degree of integration of non-volatile memory continues to increase, how to improve the electrical performance and the reliability of memory device is currently the goal of the industry.

SUMMARY OF THE INVENTION

The invention provides a non-volatile memory structure, which can effectively improve the electrical performance and the reliability of the memory device.

The invention provides a non-volatile memory structure, which includes a substrate, a stacked structure, a conductive pillar, a channel layer, a charge storage structure, and a second dielectric layer. The stacked structure is disposed on the substrate and has an opening. The stacked structure includes first conductive layers and first dielectric layers alternately stacked. The conductive pillar is disposed in the opening. The channel layer is disposed between the stacked structure and the conductive pillar. The charge storage structure is disposed between the stacked structure and the channel layer. The second dielectric layer is disposed between the channel layer and the conductive pillar.

According to an embodiment of the invention, in the non-volatile memory structure, the material of the first conductive layers is, for example, metal or doped polysilicon.

According to an embodiment of the invention, in the non-volatile memory structure, the material of the first dielectric layers is, for example, silicon oxide.

According to an embodiment of the invention, in the non-volatile memory structure, the material of the conductive pillar is, for example, metal or doped polysilicon.

According to an embodiment of the invention, in the non-volatile memory structure, the channel layer may be further disposed between the conductive pillar and the substrate.

According to an embodiment of the invention, in the non-volatile memory structure, the material of the channel layer is, for example, polysilicon.

According to an embodiment of the invention, in the non-volatile memory structure, the charge storage structure may include a charge storage layer, a third dielectric layer, and a fourth dielectric layer. The charge storage layer is disposed between the stacked structure and the channel layer. The third dielectric layer is disposed between the stacked structure and the charge storage layer. The fourth dielectric layer is disposed between the charge storage layer and the channel layer.

According to an embodiment of the invention, in the non-volatile memory structure, the charge storage layer is, for example, a charge trapping layer.

According to an embodiment of the invention, in the non-volatile memory structure, the material of the charge storage layer is, for example, silicon nitride.

According to an embodiment of the invention, in the non-volatile memory structure, the material of the third dielectric layer and the fourth dielectric layer is, for example, silicon oxide.

According to an embodiment of the invention, in the non-volatile memory structure, the material of the second dielectric layer is, for example, silicon oxide.

According to an embodiment of the invention, the non-volatile memory structure may further include a semiconductor layer. The semiconductor layer is disposed between the channel layer and the substrate.

According to an embodiment of the invention, in the non-volatile memory structure, the material of the semiconductor layer is, for example, epitaxial silicon.

According to an embodiment of the invention, the non-volatile memory structure may further include a second conductive layer. The second conductive layer is disposed above the uppermost layer of the first conductive layers and is connected to the channel layer. The second conductive layer and the uppermost layer of the first conductive layers may be isolated from each other.

According to an embodiment of the invention, in the non-volatile memory structure, the first dielectric layer may be disposed between the second conductive layer and the uppermost layer of the first conductive layers.

According to an embodiment of the invention, in the non-volatile memory structure, the material of the second conductive layer is, for example, doped polysilicon.

According to an embodiment of the invention, the non-volatile memory structure may further include a contact. The contact is electrically connected to the second conductive layer.

According to an embodiment of the invention, the non-volatile memory structure may further include a pad. The pad is disposed on the conductive pillar. The pad and the channel layer are isolated from each other.

According to an embodiment of the invention, in the non-volatile memory structure, the second dielectric layer may be further disposed between the pad and the channel layer.

According to an embodiment of the invention, the non-volatile memory structure may further include a contact. The contact is electrically connected to the pad.

Based on the above description, in the non-volatile memory structure according to the invention, since the conductive pillar can be used as a back side electrode, the electrical performance and the reliability of the non-volatile memory can be effectively improved. For example, the conductive pillar can reduce random telegraph noise (RTN) and increase electron mobility. Furthermore, when performing the erase operation, the conductive pillar can improve the erase uniformity. In addition, the conductive pillar can have the function of quick electron detrapping (QED), thereby improving the data retention capacity. On the other hand, the conductive pillar can prevent the problem of program disturb.

In order to make the aforementioned and other objects, features and advantages of the invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
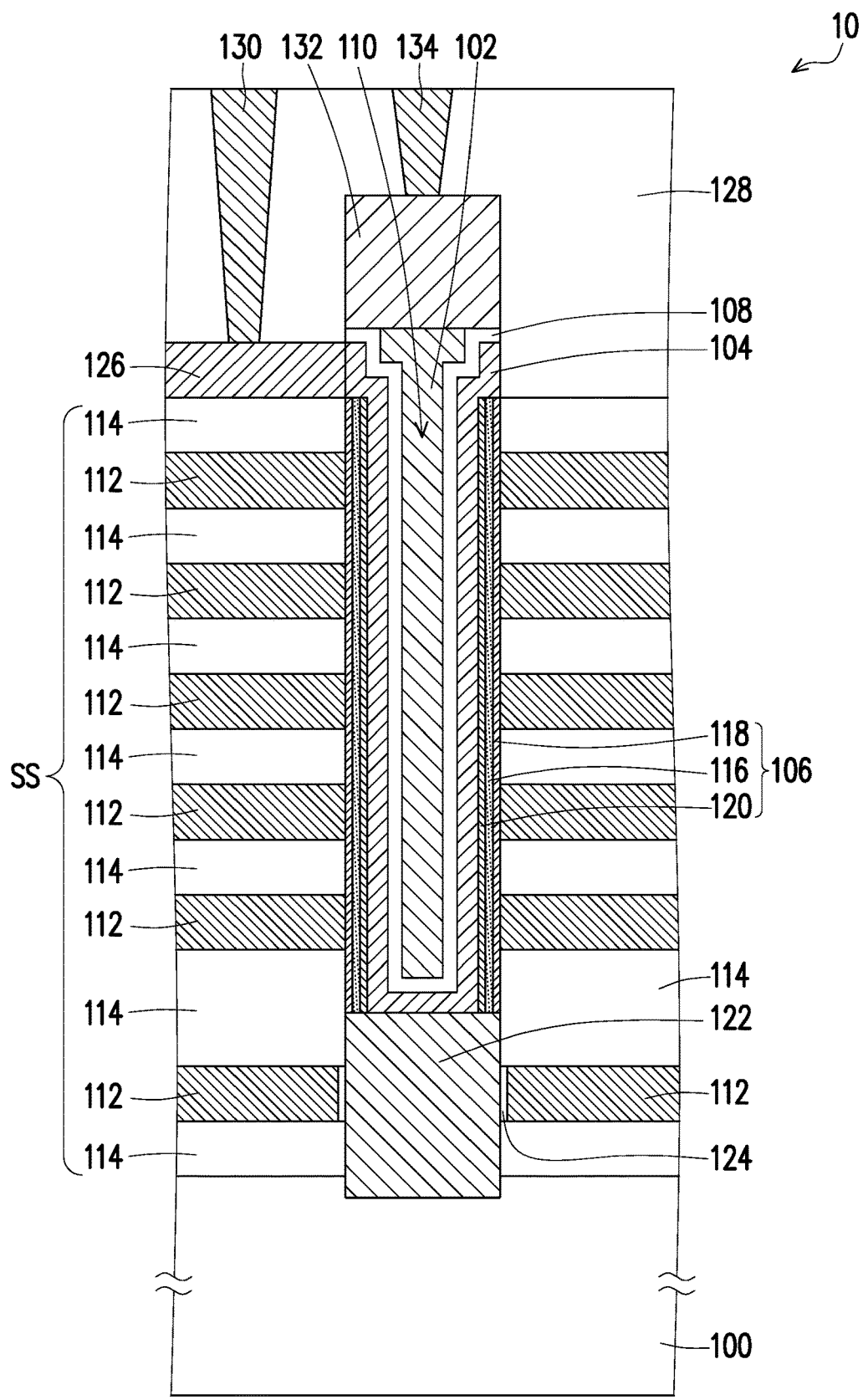
FIG. 1 is cross-sectional view illustrating a non-volatile memory structure according to an embodiment of the invention.
Figure 2:
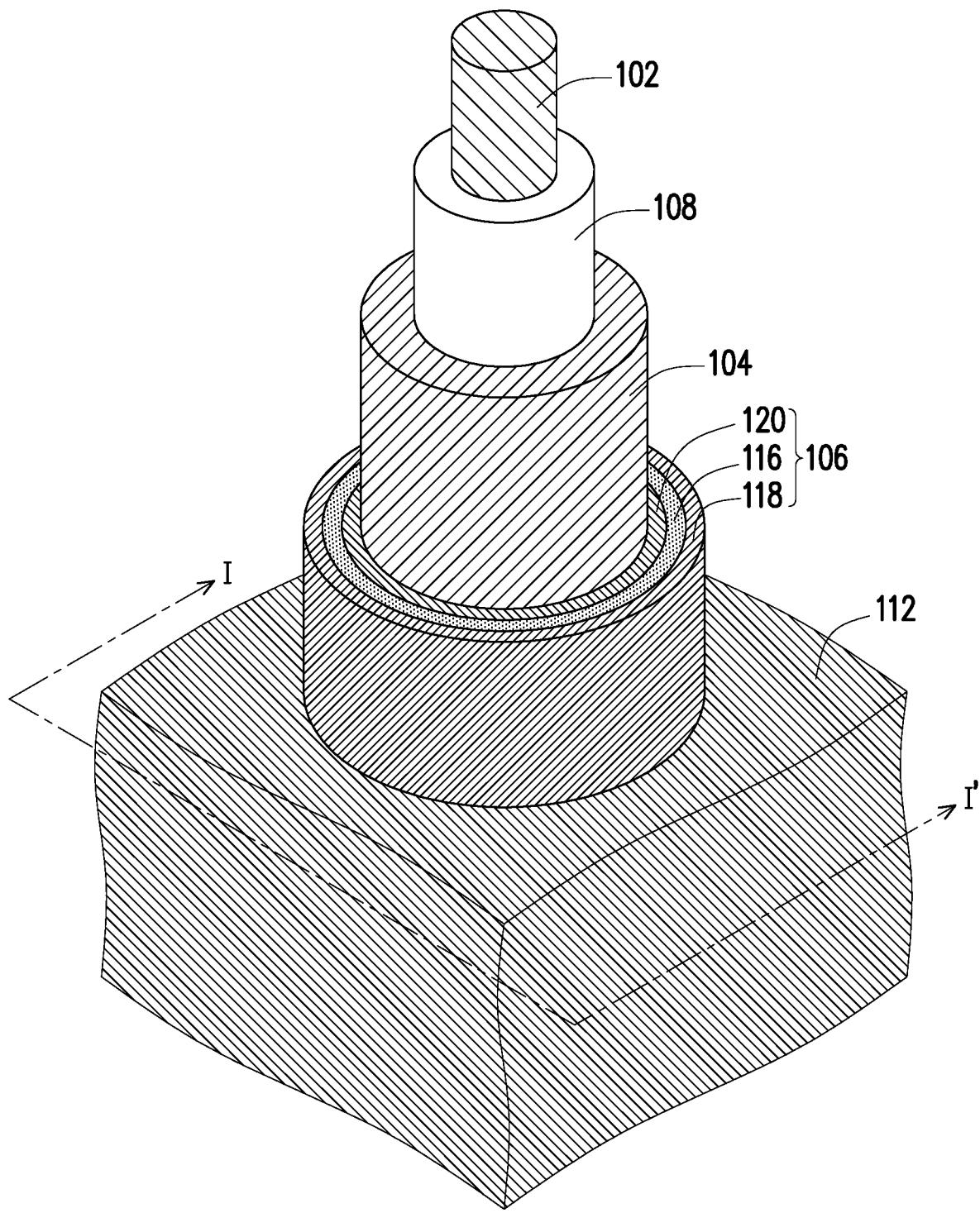
FIG. 2 is a partial perspective view of FIG. 1.
Figure 3:
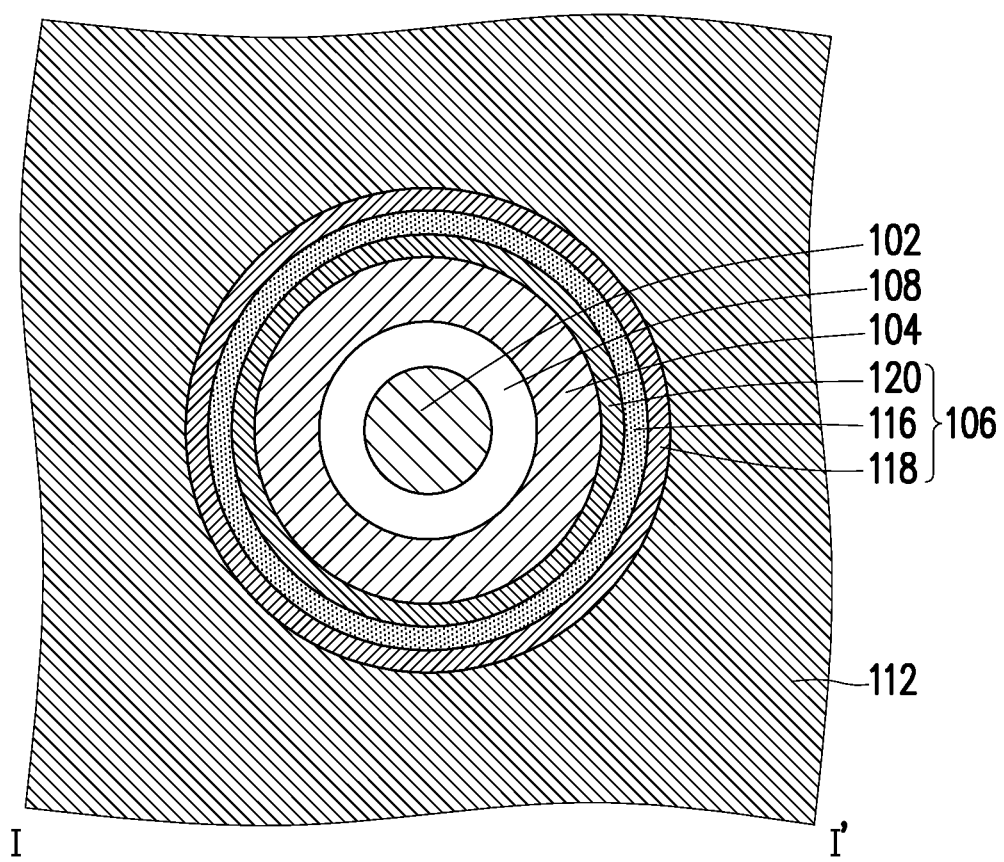
FIG. 3 is a cross-sectional view taken along section line I-I' in FIG. 2.

FIG. 1 is cross-sectional view illustrating a non-volatile memory structure according to an embodiment of the invention. FIG. 2 is a partial perspective view of FIG. 1. FIG. 3 is a cross-sectional view taken along section line I-I' in FIG. 2.

Referring to FIG. 1 to FIG. 3, the non-volatile memory structure 10 includes a substrate 100, a stacked structure SS, a conductive pillar 102, a channel layer 104, a charge storage structure 106, and a dielectric layer 108. The non-volatile memory structure 10 is, for example, a 3D NAND flash memory having a vertical channel. The substrate 100 may be a semiconductor substrate such as silicon substrate. Furthermore, the desired doped regions (not shown) can be formed in the substrate 100 depending on product design requirements.

The stacked structure SS is disposed on the substrate 100 and has an opening 110. The opening 110 may expose substrate 100. In the present embodiment, the opening 110 may be extended into the substrate 100, but the invention is not limited thereto. In other embodiments, the opening 110 may only expose substrate 100 without extending into substrate 100. The stacked structure SS includes conductive layers 112 and dielectric layers 114 alternately stacked. Among the conductive layers 112 arranged in a stack, the uppermost conductive layer 112 and the lowermost conductive layer 112 can be respectively used as select gates, and the remaining conductive layers 112 can be used as control gates, but the invention is not limited thereto. The material of the conductive layers 112 is, for example, metal or doped polysilicon. The metal is, for example, tungsten, copper, or aluminum. Furthermore, in the case where the material of the conductive layers 112 is metal, the non-volatile memory structure 10 may further include a barrier layer (not shown) disposed between the conductive layer 112 and the charge storage structure 106 and between the conductive layer 112 and the dielectric layer 114. In addition, the dielectric layer 114 may be disposed between the lowermost conductive layer 112 and the substrate 100 to isolate the lowermost conductive layer 112 from the substrate 100, but the invention is not limited thereto. The material of the dielectric layers 114 is, for example, silicon oxide.

The conductive pillar 102 is disposed in the opening 110. The conductive pillar 102 can be used as a back side electrode. The material of the conductive pillar 102 is, for example, a metal or doped polysilicon. The metal is, for example, tungsten, copper, or aluminum. When the material of the conductive pillar 102 is metal, the conductive pillar 102 can help dissipating heat, thereby preventing the problem of poor data retention capacity due to overheating.

A channel layer 104 is disposed between the stacked structure SS and the conductive pillar 102. Moreover, the channel layer 104 may be further disposed between the conductive pillar 102 and the substrate 100. The material of the channel layer 104 is, for example, polysilicon.

The charge storage structure 106 is disposed between the stacked structure SS and the channel layer 104. The charge storage structure 106 may include a charge storage layer 116, a dielectric layer 118, and a dielectric layer 120. The charge storage layer 116 is disposed between the stacked structure SS and the channel layer 104. The charge storage layer 116 is, for example, a charge trapping layer. The material of the charge storage layer 116 is, for example, silicon nitride. The dielectric layer 118 is disposed between the stacked structure SS and the charge storage layer 116. The dielectric layer 118 can be used as a block layer. The material of the dielectric layer 118 is, for example, silicon oxide. The dielectric layer 120 is disposed between the charge storage layer 116 and the channel layer 104. The dielectric layer 120 can be used as a tunneling dielectric layer. The material of the dielectric layer 120 is, for example, silicon oxide.

A dielectric layer 108 is disposed between the channel layer 104 and the conductive pillar 102. The material of the dielectric layer 108 is, for example, silicon oxide.

The non-volatile memory structure 10 may further include at least one of a semiconductor layer 122, a dielectric layer 124, a conductive layer 126, a dielectric layer 128, a contact 130, a pad 132, and a contact 134.

The semiconductor layer 122 is disposed between the channel layer 104 and the substrate 100. The channel layer 104 may be connected to the semiconductor layer 122. In other embodiments, the non-volatile memory structure 10 may not include the semiconductor layer, and the channel layer 104 may be directly connected to the substrate 100. The material of the semiconductor layer 122 is, for example, epitaxial silicon. The dielectric layer 124 is disposed between the semiconductor layer 122 and the lowermost conductive layer 112. The material of the dielectric layer 124 is, for example, silicon oxide.

The conductive layer 126 is disposed above the uppermost conductive layer 112 and is connected to the channel layer 104. The conductive layer 126 can be used as a bit line pad. The conductive layer 126 and the uppermost conductive layer 112 may be isolated from each other. For example, the dielectric layer 114 may be disposed between the conductive layer 126 and the uppermost conductive layer 112 to isolate the conductive layer 126 from the uppermost conductive layer 112, but the invention is not limited thereto. In the present embodiment, as shown in FIG. 1, the conductive layer 126 is located on the sidewall of one side of the channel layer 104. That is, the conductive layer 126 is located on a portion of the sidewall of the channel layer 104, but the invention is not limited thereto. In other embodiments, the conductive layer 126 may surround the sidewall of the channel layer 104. The material of the conductive layer 126 is, for example, doped polysilicon.

The dielectric layer 128 is disposed on the stacked structure SS and covers the conductive layer 126. The dielectric layer 128 may be a single-layer structure or a multilayer structure. The material of the dielectric layer 128 is, for example, silicon oxide, silicon nitride, or a combination thereof.

The contact 130 is electrically connected to the conductive layer 126. In the present embodiment, the contact 130 may be disposed in the dielectric layer 128. The material of the contact 130 is, for example, tungsten. In the present embodiment, the channel layer 104 may be coupled to the bit line (not shown) by the conductive layer 126 and the contact 130, but the invention is not limited thereto.

The pad 132 is disposed on the conductive pillar 102. In the present embodiment, the pad 132 may be disposed in the dielectric layer 128. The pad 132 and the channel layer 104 are isolated from each other. For example, the dielectric layer 108 may be further disposed between the pad 132 and the channel layer 104 to isolate the pad 132 from the channel layer 104, but the invention is not limited thereto. The material of the pad 132 is, for example, copper, aluminum, or tungsten.

The contact 134 is electrically connected to the pad 132. In the present embodiment, the contact 134 may be disposed in the dielectric layer 128. The material of the contact 134 is, for example, tungsten.

The non-volatile memory structure 10 may further include other components (e.g., the bit line and the source line) well known to those of ordinary skill in the art, and the description thereof is omitted herein.

Based on the above embodiments, in the non-volatile memory structure 10, since the conductive pillar 102 can be used as a back side electrode, the electrical performance and the reliability of the non-volatile memory can be effectively improved. For example, the conductive pillar 102 can reduce random telegraph noise (RTN) and increase electron mobility. Furthermore, when performing the erase operation, the conductive pillar 102 can improve the erase uniformity. In addition, the conductive pillar 102 can have the function of quick electron detrapping (QED), thereby improving the data retention capacity. On the other hand, the conductive pillar 102 can prevent the problem of program disturb.

In summary, the non-volatile memory structure of the aforementioned embodiment can effectively improve the electrical performance and the reliability of the non-volatile memory by the conductive pillar (back side electrode).

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A non-volatile memory structure, comprising:
    a substrate;
    a stacked structure disposed on the substrate and having an opening, wherein the stacked structure comprises first conductive layers and first dielectric layers alternately stacked;
    a conductive pillar disposed in the opening;
    a channel layer disposed between the stacked structure and the conductive pillar;
    a charge storage structure disposed between the stacked structure and the channel layer; and
    a second dielectric layer disposed between the channel layer and the conductive pillar.

2. The non-volatile memory structure according to claim 1, wherein a material of the first conductive layers comprises metal or doped polysilicon.

3. The non-volatile memory structure according to claim 1, wherein a material of the first dielectric layers comprises silicon oxide.

4. The non-volatile memory structure according to claim 1, wherein a material of the conductive pillar comprises metal or doped polysilicon.

5. The non-volatile memory structure according to claim 1, wherein the channel layer is further disposed between the conductive pillar and the substrate.

6. The non-volatile memory structure according to claim 1, wherein a material of the channel layer comprises polysilicon.

7. The non-volatile memory structure according to claim 1, wherein the charge storage structure comprises:
    a charge storage layer disposed between the stacked structure and the channel layer;
    a third dielectric layer disposed between the stacked structure and the charge storage layer; and
    a fourth dielectric layer disposed between the charge storage layer and the channel layer.

8. The non-volatile memory structure according to claim 7, wherein the charge storage layer comprises a charge trapping layer.

9. The non-volatile memory structure according to claim 7, wherein a material of the charge storage layer comprises silicon nitride.

10. The non-volatile memory structure according to claim 7, wherein a material of the third dielectric layer and the fourth dielectric layer comprises silicon oxide.

11. The non-volatile memory structure according to claim 1, wherein a material of the second dielectric layer comprises silicon oxide.

12. The non-volatile memory structure according to claim 1, further comprising:
    a semiconductor layer disposed between the channel layer and the substrate.

13. The non-volatile memory structure according to claim 12, wherein a material of the semiconductor layer comprises epitaxial silicon.

14. The non-volatile memory structure according to claim 1, further comprising:
    a second conductive layer disposed above an uppermost layer of the first conductive layers and connected to the channel layer, wherein the second conductive layer and the uppermost layer of the first conductive layers are isolated from each other.

15. The non-volatile memory structure according to claim 14, wherein the first dielectric layer is disposed between the second conductive layer and the uppermost layer of the first conductive layers.

16. The non-volatile memory structure according to claim 14, wherein a material of the second conductive layer comprises doped polysilicon.

17. The non-volatile memory structure according to claim 14, further comprising:
    a contact electrically connected to the second conductive layer.

18. The non-volatile memory structure according to claim 1, further comprising:
    a pad disposed on the conductive pillar, wherein the pad and the channel layer are isolated from each other.

19. The non-volatile memory structure according to claim 18, wherein the second dielectric layer is further disposed between the pad and the channel layer.

20. The non-volatile memory structure according to claim 18, further comprising:
a contact electrically connected to the pad.

* * * * *